United States Patent [19]

Kadosh et al.

[11] Patent Number: 5,677,224
[45] Date of Patent: Oct. 14, 1997

[54] METHOD OF MAKING ASYMMETRICAL N-CHANNEL AND P-CHANNEL DEVICES

[75] Inventors: Daniel Kadosh, Austin; Mark I. Gardner, Cedar Creek, both of Tex.

[73] Assignee: Advanced Micro Devices, Inc., Sunnyvale, Calif.

[21] Appl. No.: 711,381

[22] Filed: Sep. 3, 1996

[51] Int. Cl.⁶ .................................................. H01L 21/70
[52] U.S. Cl. ............................ 437/57; 437/34; 437/44; 437/58; 257/274; 257/336; 257/338; 257/369
[58] Field of Search .............................. 437/34, 57, 58, 437/44

[56] References Cited

U.S. PATENT DOCUMENTS

| | | | |
|---|---|---|---|
| 5,286,664 | 2/1994 | Horiuchi | 437/44 |
| 5,424,229 | 6/1995 | Oyamatsu | 437/35 |

OTHER PUBLICATIONS

U.S. Patent Application, Serial No. 08/682,238, filed Jul. 17, 1996, entitled "Method For Fabrication Of A Non–Symmetrical Transistor", by Mark I. Gardner, Derick J. Wristers and H. Jim Fulford, Jr.

U.S. Patent Application, Serial No. 08/682,493, filed Jul. 17, 1996, entitled "Method For Fabrication Of A Non–Symmetrical Transistor", by Mark I. Gardner, Michael P. Duane and Derick J. Wristers.

Primary Examiner—John Niebling
Assistant Examiner—Long Pham
Attorney, Agent, or Firm—Skjerven, Morrill, MacPherson, Franklin & Friel; David M. Sigmond

[57] ABSTRACT

An asymmetrical N-channel IGFET and an asymmetrical P-channel IGFET are disclosed. One or both IGFETs include a lightly doped drain region, heavily doped source and drain regions, and an ultra-heavily doped source region. Preferably, the heavily doped source region and lightly doped drain region provide channel junctions. Forming a first asymmetrical IGFET includes forming a gate with first and second opposing sidewalls over a first active region, applying a first ion implantation to implant lightly doped source and drain regions into the first active region, applying a second ion implantation to convert substantially all of the lightly doped source region into a heavily doped source region without doping the lightly doped drain region, forming first and second spacers adjacent to the first and second sidewalls, respectively, and applying a third ion implantation to convert a portion of the heavily doped source region outside the first spacer into an ultra-heavily doped source region without doping a portion of the heavily doped source region beneath the first spacer, and to convert a portion of the lightly doped drain region outside the second spacer into a heavily doped drain region without doping a portion of the lightly doped drain region beneath the second spacer. A second asymmetrical IGFET is formed in a related manner. Advantageously, one or both IGFETs have low source-drain series resistance and reduce hot carrier effects.

20 Claims, 7 Drawing Sheets

METHOD OF MAKING ASYMMETRICAL N-CHANNEL AND P-CHANNEL DEVICES

BACKGROUND OF THE INVENTION

1. Field of the Invention

The present invention relates to integrated circuit manufacturing, and more particularly to insulated-gate field-effect transistors.

2. Description of Related Art

An insulated-gate field-effect transistor (IGFET), such as a metal-oxide semiconductor field-effect transistor (MOSFET), uses a gate to control an underlying surface channel joining a source and a drain. The channel, source and drain are located in a semiconductor substrate, with the source and drain being doped oppositely to the substrate. The gate is separated from the semiconductor substrate by a thin insulating layer such as a gate oxide. The operation of the IGFET involves application of an input voltage to the gate, which sets up a transverse electric field in the channel in order to modulate the longitudinal conductance of the channel.

In typical IGFET processing, the source and drain are formed by introducing dopants of second conductivity type (P or N) into a semiconductor substrate of first conductivity type (N or P) using a patterned gate as a mask. This self-aligning procedure tends to improve packing density and reduce parasitic overlap capacitances between the gate and the source and drain.

Polysilicon (also called polycrystalline silicon, poly-Si or poly) thin films have many important uses in IGFET technology. One of the key innovations is the use of heavily doped polysilicon in place of aluminum as the gate. Since polysilicon has the same high melting point as a silicon substrate, typically a blanket polysilicon layer is deposited prior to source and drain formation, and the polysilicon is anisotropically etched to provide a gate which provides a mask during formation of the source and drain by ion implantation. Thereafter, a drive-in step is applied to repair crystalline damage and to drive-in and activate the implanted dopant.

As IGFET dimensions are reduced and the supply voltage remains constant (e.g., 3V), the electric field in the channel near the drain tends to increase. If the electric field becomes strong enough, it can give rise to so-called hot-carrier effects. For instance, hot electrons can overcome the potential energy barrier between the substrate and the gate insulator thereby causing hot carriers to become injected into the gate insulator. Trapped charge in the gate insulator due to injected hot carriers accumulates over time and can lead to a permanent change in the threshold voltage of the device.

A number of techniques have been utilized to reduce hot carrier effects. One such technique is a lightly doped drain (LDD). The LDD reduces hot carrier effects by reducing the maximum lateral electric field. The drain is typically formed by two ion implants. A light implant is self-aligned to the gate, and a heavy implant is self-aligned to the gate on which sidewall spacers have been formed. The spacers are typically oxides or nitrides. The purpose of the lighter first dose is to form a lightly doped region of the drain (or LDD) at the edge near the channel. The second heavier dose forms a low resistivity heavily doped region of the drain, which is subsequently merged with the lightly doped region. Since the heavily doped region is farther away from the channel than a conventional drain structure, the depth of the heavily doped region can be made somewhat greater without adversely affecting the device characteristics. The lightly doped region is not necessary for the source (unless bidirectional current is used), however lightly doped regions are typically formed for both the source and drain to avoid additional processing steps.

Disadvantages of LDDs include increased fabrication complexity and increased parasitic resistance due to their light doping levels. During operation, LDD parasitic resistance decreases drain current. Linear drain current (i.e., drain current in the linear or triode region) is reduced by the parasitic resistance in both the source and drain. Saturation drain current (i.e., drain current in the saturation region) is largely unaffected by the parasitic resistance of the drain but greatly reduced by the parasitic resistance of the source. Therefore, saturation drain current can be improved while reducing hot carrier effects by providing a lightly doped region only on the drain side. That is, the drain includes lightly and heavily doped regions, and the entire source is heavily doped.

Asymmetrical IGFETs (with asymmetrically doped sources and drains) are known in the art. For instance, U.S. Pat. No. 5,424,229 entitled "Method For Manufacturing MOSFET Having An LDD Structure" by Oyamatsu discloses providing a mask with an opening over a substrate, implanting a dopant through the opening at an angle to the substrate to form a lightly doped drain region on one side without a corresponding source region on the other side, forming a gate in the opening which overlaps the lightly doped drain region, removing the mask, and implanting heavily doped source and drain regions using the gate as an implant mask. As another example, U.S. Pat. No. 5,286,664 entitled "Method For Fabricating The LDD-MOSFET" by Horiuchi discloses forming a gate, implanting lightly doped source and drain regions using the gate as an implant mask, forming a photoresist layer that covers the source side and exposes the drain side, depositing a single spacer on the drain side using liquid phase deposition (LPD) of silicon dioxide, stripping the photoresist, and implanting heavily doped source and drain regions using the gate and single spacer as an implant mask.

A drawback to these and other conventional asymmetrical IGFETs is that the heavily doped source and drain regions typically have identical dopant concentrations. Although the doping concentration of the heavily doped drain region may be constrained in order to reduce hot carrier effects, the doping concentration of the heavily doped source region need not be constrained in this manner. Furthermore, increasing the doping concentration of the heavily doped source region reduces the source-drain series resistance, thereby improving drive current.

Complementary metal-oxide semiconductor (CMOS) circuits typically include adjacent N-channel (NMOS) and P-channel (PMOS) devices. Since CMOS inverter circuits use very little power, CMOS is particularly useful in very large-scale integrated (VLSI) circuits where even small power dissipation in each transistor becomes a problem when thousands or millions of transistors are integrated on a chip. CMOS processes typically use N-well and P-well masks early in the processing sequence to define N-type and P-type active regions. CMOS processes also typically include a single masking step for forming the gates, separate masking steps for implanting lightly doped N-type source/drain regions into the P-type active region and lightly doped P-type source/drain regions into the N-type active region, formation of oxide spacers adjacent to the gates, and then separate masking steps for implanting heavily doped N-type source/drain regions into the P-type active region and heavily doped P-type source/drain regions into the N-type active region.

Accordingly, a need exists for improved asymmetrical N-channel and P-channel IGFETs that reduce both source-drain series resistance and hot carrier effects.

SUMMARY OF THE INVENTION

The present invention provides an asymmetrical N-channel IGFET and an asymmetrical P-channel IGFET. One or both IGFETs include a lightly doped drain region, heavily doped source and drain regions, and an ultra-heavily doped source region. Preferably, the lightly doped drain region and the heavily doped source region provide channel junctions, and the heavily doped drain region and the ultra-heavily doped source region are spaced from the channel junctions. Advantageously, one or both IGFETs have low source-drain series resistance and reduce hot carrier effects.

By definition, the dopant concentration of the ultra-heavily doped source region exceeds that of the heavily doped source and drain regions, and the dopant concentration of the heavily doped source and drain regions exceeds that of the lightly doped drain region. Furthermore, the heavily doped source and drain regions need not have similar dopant concentrations.

Preferably, both the N-channel and P-channel IGFETs include a source that consists of heavily doped and ultra-heavily doped source regions, and a drain that consists of the lightly doped and heavily doped drain regions. It is also preferred that the dopant concentration of the ultra-heavily doped source regions is in the range of 1.5 to 10 times that of the heavily doped source and drain regions, and the dopant concentration of the heavily doped source and drain regions is in the range of 10 to 100 times that of the lightly doped drain regions, and furthermore that the dopant concentration of the lightly doped drain regions is in the range of about $1\times10^{17}$ to $5\times10^{18}$ atoms/cm$^3$, the dopant concentration of the heavily doped source and drain regions is in the range of about $1\times10^{19}$ to $1\times10^{20}$ atoms/cm$^3$, and the dopant concentration of the ultra-heavily doped source regions is in the range of about $1.5\times10^{19}$ to $1\times10^{21}$ atoms/cm$^3$.

In accordance with an aspect of the invention, a method of making asymmetrical N-channel and P-channel IGFETs includes providing a semiconductor substrate with a first active region of first conductivity type and a second active region of second conductivity type adjacent to an isolation region.

Forming a first IGFET includes forming a first gate with first and second opposing sidewalls over the first active region, applying a first ion implantation of second conductivity type to implant first lightly doped source and drain regions into the first active region, applying a second ion implantation of second conductivity type to convert substantially all of the first lightly doped source region into a first heavily doped source region without doping the first lightly doped drain region, forming first and second spacers adjacent to the first and second sidewalls, respectively, and applying a third ion implantation of second conductivity type to convert a portion of the first heavily doped source region outside the first spacer into a first ultra-heavily doped source region without doping a portion of the first heavily doped source region beneath the first spacer, and to convert a portion of the first lightly doped drain region outside the second spacer into a first heavily doped drain region without doping a portion of the first lightly doped drain region beneath the second spacer. A first source in the first active region includes the first heavily doped and ultra-heavily doped source regions, and a first drain in the first active region includes the first lightly doped and heavily doped drain regions.

Forming a second IGFET includes forming a second gate with third and fourth opposing sidewalls over the second active region, applying a first ion implantation of first conductivity type to implant second lightly doped source and drain regions into the second active region, forming third and fourth spacers adjacent to the third and fourth sidewalls, respectively, applying a second ion implantation of first conductivity type to convert a portion of the second lightly doped source region outside the third spacer into a second heavily doped source region without doping a portion of the second lightly doped source region beneath the third spacer, and to convert a portion of the second lightly doped drain region outside the fourth spacer into a second heavily doped drain region without doping a portion of the second lightly doped drain region beneath the fourth spacer, removing at least portions of the third and fourth spacers, and applying a third ion implantation of first conductivity type to convert the second heavily doped source region into a second ultra-heavily doped source region and to convert substantially all of the second lightly doped source region into a third heavily doped source region without doping the second lightly and heavily doped drain regions. A second source in the second active region includes the third heavily doped and the second ultra-heavily doped source regions, and a second drain in the second active region includes the second lightly doped and heavily doped drain regions.

Preferably, the method includes forming an insulating layer over the substrate to provide first, second, third and fourth sidewall insulators adjacent to the first, second, third and fourth sidewalls, respectively, depositing a blanket layer of insulative spacer material on the insulating layer, and applying an anisotropic etch such that first, second, third and fourth insulative spacers are adjacent to the first, second, third and fourth sidewall insulators, respectively. In this manner, the first spacer includes the first sidewall insulator and the first insulative spacer, the second spacer includes the second sidewall insulator and the second insulative spacer, the third spacer includes the third sidewall insulator and the third insulative spacer, and the fourth spacer includes the fourth sidewall insulator and the fourth insulative spacer. Removing at least portions of the third and fourth spacers is accomplished by removing the insulative spacers without removing the sidewall insulators.

Another aspect of the method includes forming the first and second gates, forming a first photoresist layer that covers the second active region, applying the first ion implantation of second conductivity type using the first photoresist layer and the first gate as an implant mask, forming a second photoresist layer that covers the first active region, applying the first ion implantation of first conductivity type using the second photoresist layer and the second gate as an implant mask, forming the insulating layer, forming a third photoresist layer that covers the second active region and the first lightly doped drain region, applying the second ion implantation of second conductivity type using the third photoresist layer and the first sidewall insulator and a portion of the first gate as an implant mask, forming the insulative spacers, forming a fourth photoresist layer that covers the second active region, applying the third ion implantation of second conductivity type using the fourth photoresist layer and the first gate and the first and second spacers as an implant mask, forming a fifth photoresist layer that covers the first active region, applying the second ion implantation of first conductivity type using the fifth photoresist layer and the second gate and the third and fourth spacers as an implant mask, removing the insulative spacers, forming a sixth photoresist layer that covers the fast active region and the second lightly and heavily doped drain regions, and applying the third ion implantation of first conductivity type using the sixth photoresist layer and the third sidewall insulator and a portion of the second gate as an implant mask.

These and other aspects, features and advantages of the invention will be further described and more readily apparent from a review of the detailed description of the preferred embodiments which follow.

BRIEF DESCRIPTION OF THE DRAWINGS

The following detailed description of the preferred embodiments can best be understood when read in conjunction with the following drawings, in which.

DETAILED DESCRIPTION OF THE PREFERRED EMBODIMENTS

Figure 1A:
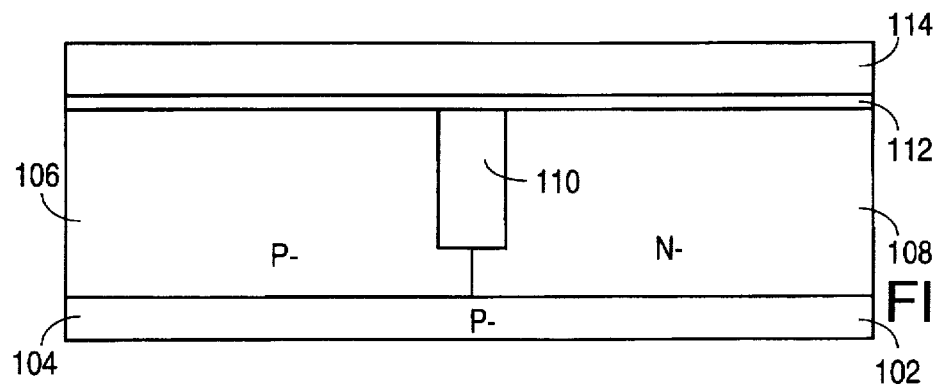
FIGS. 1A–1U show cross-sectional views of successive process steps for making an asymmetrical N-channel IGFET and an asymmetrical P-channel IGFET in accordance with an embodiment of the invention.

In the drawings, depicted elements are not necessarily drawn to scale and like or similar elements may be designated by the same reference numeral throughout the several views.

In FIG. 1A, silicon substrate 102 suitable for integrated circuit manufacture includes P-type epitaxial layer 104. Preferably, epitaxial layer 104 is disposed on a P+ base layer (not shown). Substrate 102 also includes P− active region 106 and N− active region 108 adjacent to a planar top surface. Active region 106 has a boron background concentration on the order of $1\times10^{16}$ atoms/cm$^3$, a <100> orientation and a resistivity of 12 ohm-cm, and active region 108 has an arsenic background concentration on the order of $1\times10^{16}$ atoms/cm$^3$, a <100> orientation and a resistivity of 12 ohm-cm. Trench oxide 110, composed of silicon dioxide ($SiO_2$), provides dielectric isolation between active regions 106 and 108. Gate oxide 112, composed of silicon dioxide, is formed on the top surface of substrate 102 using tube growth at a temperature of 700° to 1000° C. in an $O_2$ containing ambient. Gate oxide 112 has a thickness of 50 angstroms. Thereafter, a blanket layer of undoped polysilicon 114 is deposited by low pressure chemical vapor deposition (LPCVD) on the top surface of gate oxide 112. Polysilicon 114 has a thickness of 2000 angstroms. If desired, polysilicon 114 can be doped in situ as deposition occurs, or doped before a subsequent etch step by implanting arsenic with a dosage in the range of $1\times10^{15}$ to $5\times10^{15}$ atoms/cm$^2$ and an energy in the range of 2 to 80 kiloelectron-volts. However, it is generally preferred that polysilicon 114 be doped during an implantation step following a subsequent etch step.

Figure 1B:
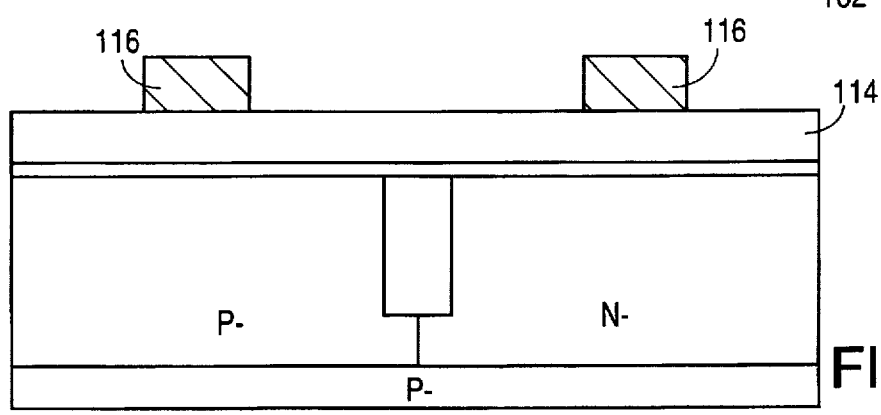

In FIG. 1B, photoresist 116 is deposited as a continuous layer on polysilicon 114 and selectively irradiated using a photolithographic system, such as a step and repeat optical projection system, in which I-line ultraviolet light from a mercury-vapor lamp is projected through a first reticle. Thereafter, photoresist 116 is developed and the irradiated portions are removed to provide openings in photoresist 116. The openings expose portions of polysilicon 114, thereby defining first and second gates.

Figure 1C:
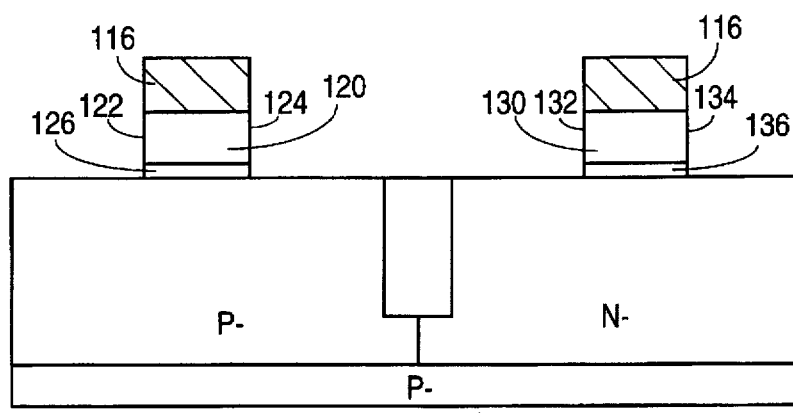

In FIG. 1C, an anisotropic etch is applied that removes the exposed portions of polysilicon 114 and the underlying portions of gate oxide 112. Preferably, a first dry etch is applied that is highly selective of polysilicon, and a second dry etch is applied that is highly selective of silicon dioxide, using photoresist 116 as an etch mask. After etching occurs, the remaining portions of polysilicon 114 and gate oxide 112 above active region 106 provide polysilicon gate 120 with opposing vertical sidewalls 122 and 124 on gate oxide 126, and polysilicon gate 130 with opposing vertical sidewalls 132 and 134 on gate oxide 136. Polysilicon gate 120 has a length (between sidewalls 122 and 124) of 3500 angstroms, and polysilicon gate 130 has a length (between sidewalls 132 and 134) of 3500 angstroms.

Figure 1D:
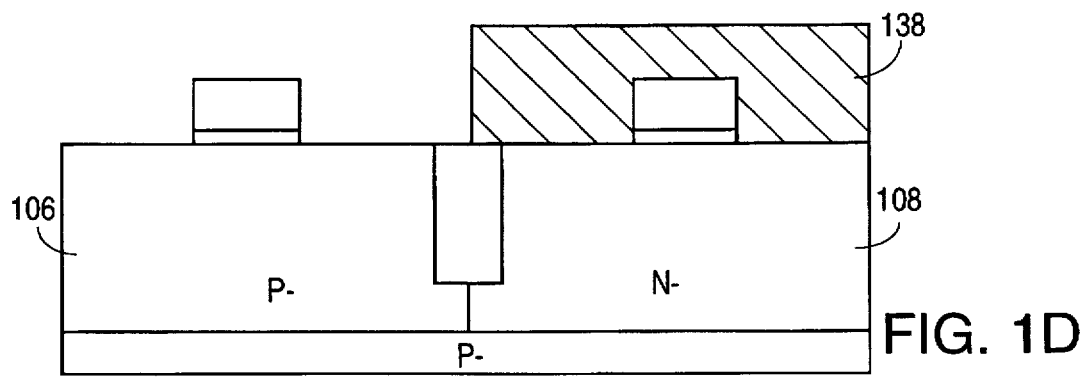

In FIG. 1D, photoresist 116 is stripped, photoresist 138 is deposited as a continuous layer over substrate 102 and selectively irradiated using the photolithographic system and a second reticle, and the irradiated portions are removed to provide an opening in photoresist 138. The opening is above active region 106, and photoresist 138 covers active region 108.

Figure 1E:
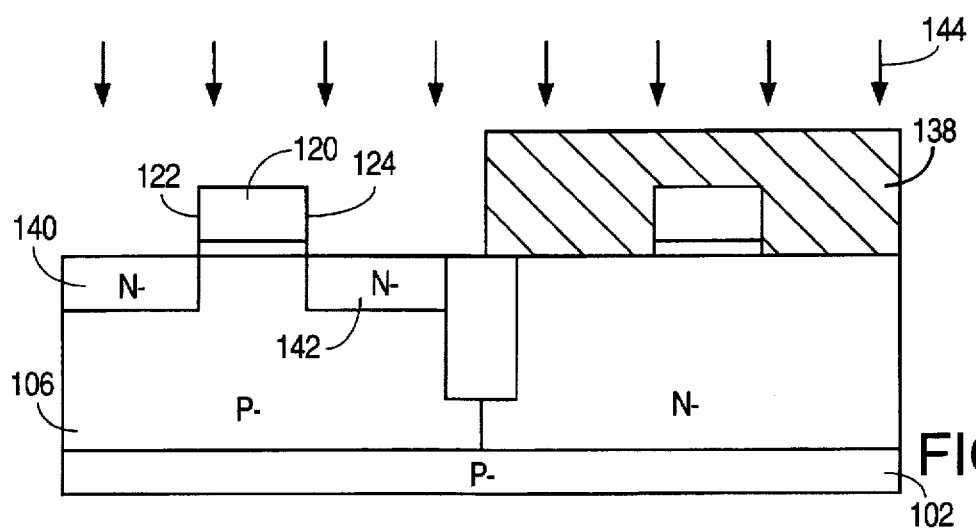

In FIG. 1E, lightly doped source and drain regions 140 and 142 are implanted into active region 106 by subjecting the structure to ion implantation of phosphorus, indicated by arrows 144, at a dose in the range of $1\times10^{13}$ to $5\times10^{14}$ atoms/cm$^2$ and an energy in the range of 2 to 35 kiloelectron-volts. Polysilicon gate 120 and photoresist 138 provide an implant mask for the underlying portion of substrate 102. As a result, lightly doped source and drain regions 140 and 142 are substantially aligned with sidewalls 122 and 124, respectively. Lightly doped source and drain regions 140 and 142 are doped N− with a phosphorus concentration in the range of about $1\times10^{17}$ to $5\times10^{18}$ atoms/cm$^3$.

Figure 1F:
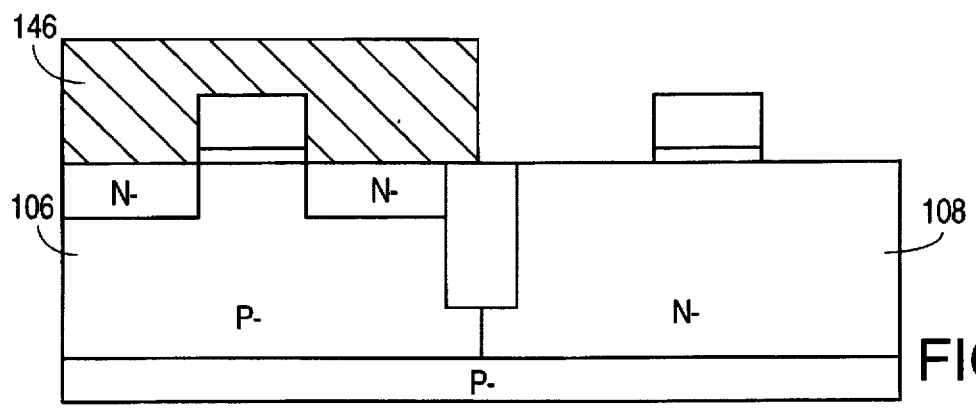

In FIG. 1F, photoresist 138 is stripped, photoresist 146 is deposited as a continuous layer over substrate 102 and selectively irradiated using the photolithographic system and a third reticle, and the irradiated portions are removed to provide an opening in photoresist 146. The opening is above active region 108, and photoresist 146 covers active region 106.

Figure 1G:
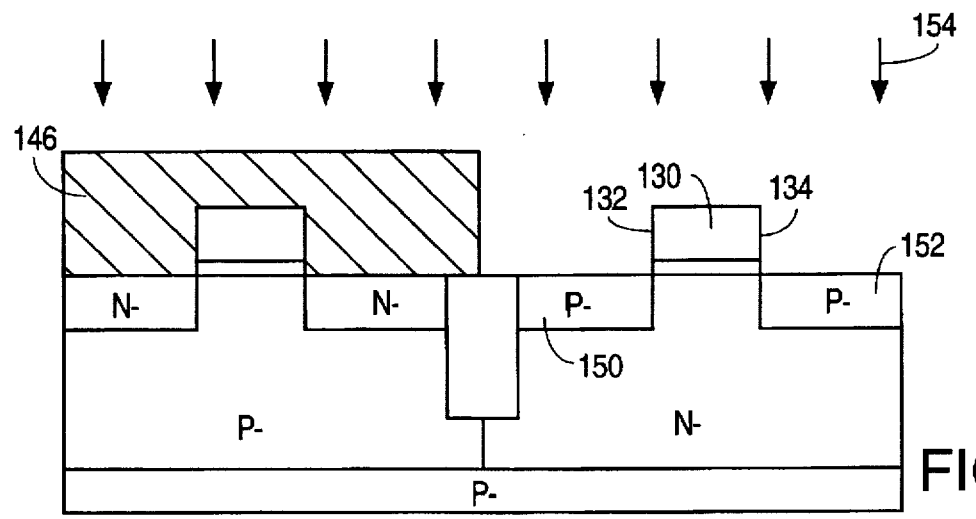

In FIG. 1G, lightly doped source and drain regions 150 and 152 are implanted into active region 108 by subjecting the structure to ion implantation of boron difluoride ($BF_2$), indicated by arrows 154, at a dose in the range of $1\times10^{13}$ to $5\times10^{14}$ atoms/cm$^2$ and an energy in the range of 2 to 35 kiloelectron-volts. Polysilicon gate 130 and photoresist 146 provide an implant mask for the underlying portion of substrate 102. As a result, lightly doped source and drain regions 150 and 152 are substantially aligned with sidewalls 132 and 134, respectively. Lightly doped source and drain regions 150 and 152 are doped P− with a boron concentration in the range of about $1\times10^{17}$ to $5\times10^{18}$ atoms/cm$^3$.

Figure 1H:
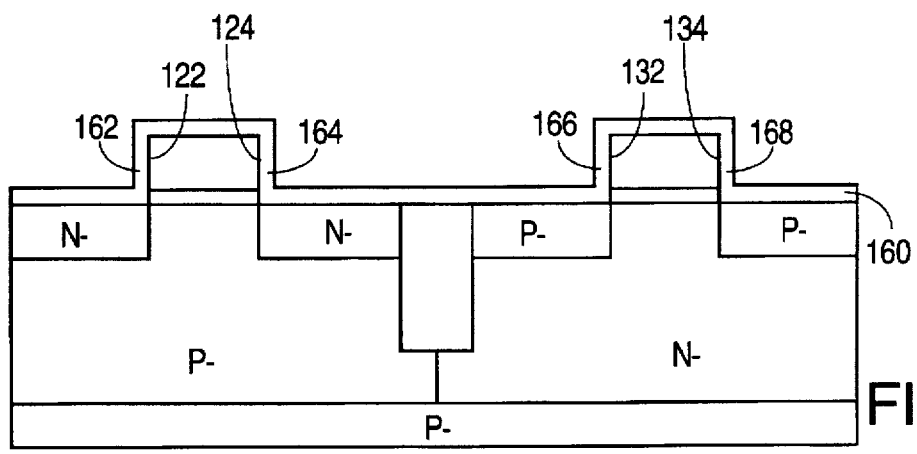

In FIG. 1H, photoresist 146 is stripped, and oxide layer 160 is deposited over substrate 102 using a low temperature deposition process. Oxide layer 160 has a thickness in the range of 100 to 500 angstroms. Oxide layer 160 includes sidewall oxide 162 adjacent to sidewall 122, sidewall oxide 164 adjacent to sidewall 124, sidewall oxide 166 adjacent to sidewall 132, and sidewall oxide 168 adjacent to sidewall 134.

Figure 1I:
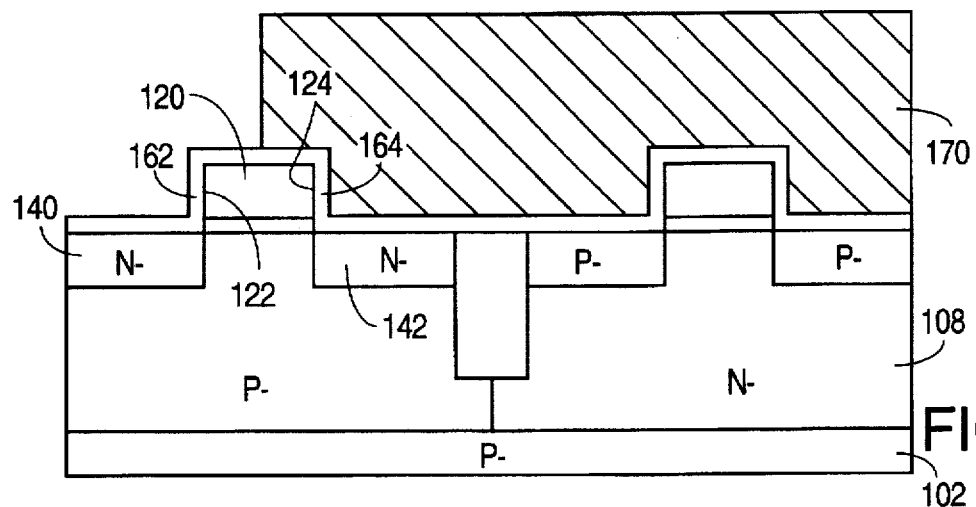

In FIG. 1I, photoresist 170 is deposited as a continuous layer over substrate 102 and selectively irradiated using the photolithographic system and a fourth reticle, and the irradiated portions are removed to provide an opening in photoresist 170. The opening is above lightly doped source region 140, sidewall oxide 162, and a first portion of polysilicon gate 120 adjacent to sidewall 122. Photoresist 170 covers lightly doped drain region 142, sidewall oxide 164, a second portion of polysilicon gate 120 adjacent to sidewall 124, and active region 108.

Figure 1J:
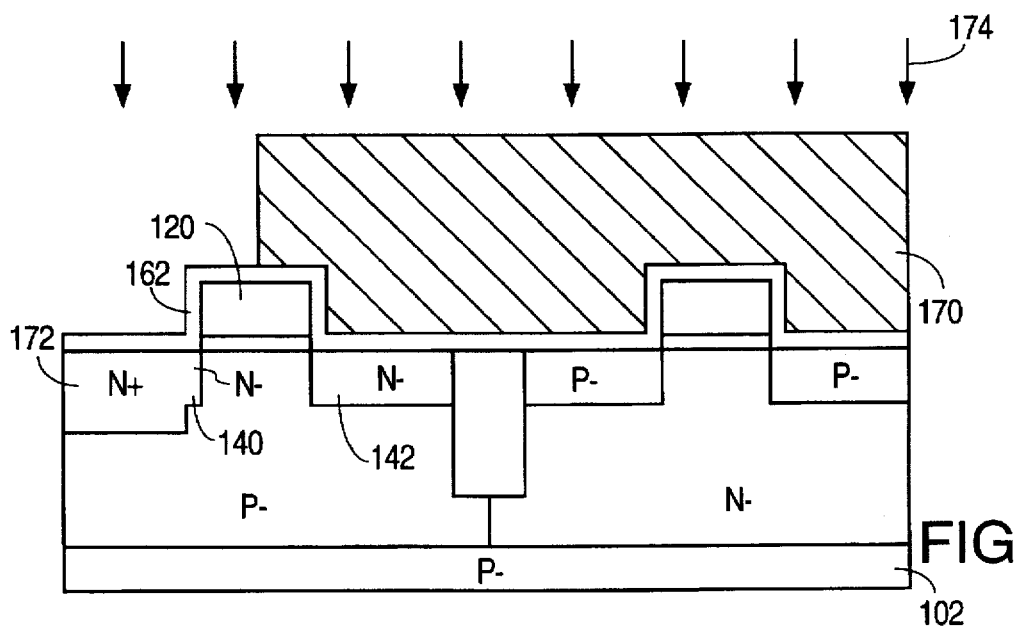

In FIG. 1J, substantially all of lightly doped source region 140 is converted into heavily doped source region 172 by subjecting the structure to ion implantation of arsenic, indicated by arrows 174, at a dose of $4.5 \times 10^{15}$ atoms/cm$^2$ and an energy in the range of 10 to 80 kiloelectron-volts. Photoresist 170 and sidewall oxide 162 and the first portion of polysilicon gate 120 (outside photoresist 170) provide an implant mask for the underlying portion of substrate 102. As a result, heavily doped source region 172 is substantially aligned with sidewall oxide 162 on the side opposite polysilicon gate 120, and lightly doped drain region 142 is essentially unaffected. Heavily doped source region 172 is doped N+ with an arsenic concentration in the range of about $1 \times 10^{19}$ to $1 \times 10^{20}$ atoms/cm$^3$. Preferably, the dopant concentration of heavily doped source region 172 is at least 10 times that of lightly doped drain region 142. As is seen, a very small portion of lightly doped source region 140 remains beneath sidewall oxide 162.

Figure 1K:
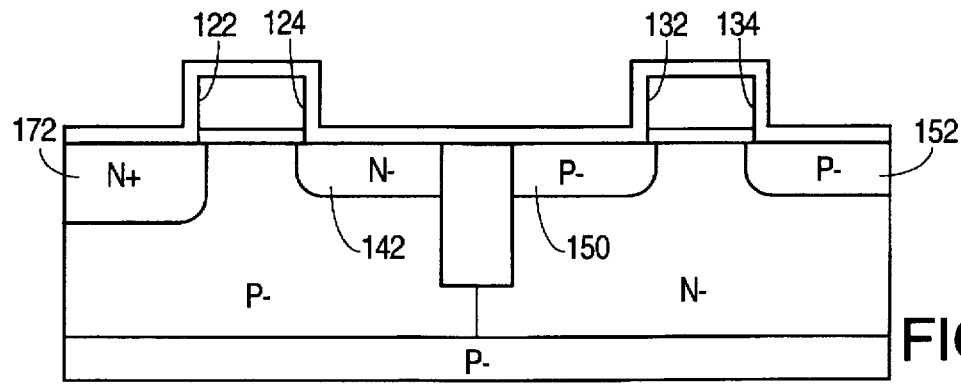

In FIG. 1K, photoresist 170 is stripped, and a tube anneal on the order of 850° C. for 60 minutes is applied to remove crystalline damage and to drive-in and activate the implanted dopants. As a result, heavily doped source region 172 diffuses into and essentially eliminates lightly doped source region 140. Furthermore, heavily doped source region 172 and lightly doped drain region 142 diffuse slightly beneath sidewalls 122 and 124, respectively, and lightly doped source region 150 and lightly doped drain region 152 diffuse slightly beneath sidewalls 132 and 134, respectively.

Figure 1L:
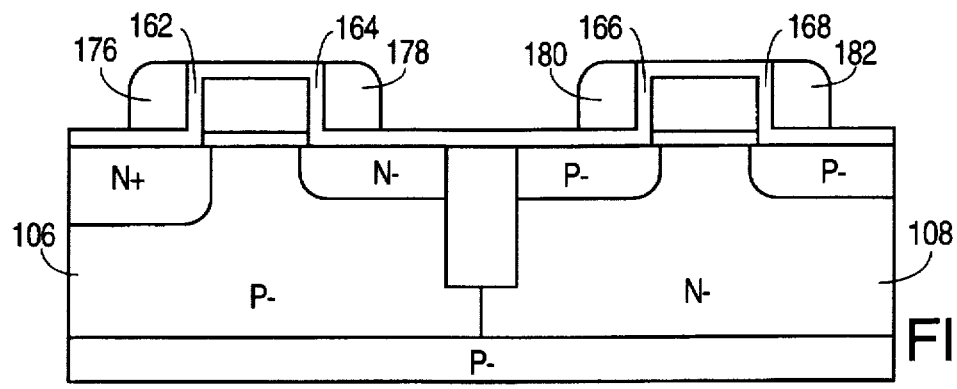

In FIG. 1L, a blanket layer of silicon nitride (Si$_3$N$_4$) with a thickness of 2500 angstroms is conformally deposited over the exposed surfaces by plasma enhanced chemical vapor deposition (PECVD) at a temperature in the range of 300° to 800° C. Thereafter, the structure is subjected to an anisotropic etch, such as a reactive ion etch, that is highly selective of silicon nitride with respect to silicon dioxide. The anisotropic etch forms nitride spacers 176, 178, 180 and 182 adjacent to sidewall oxides 162, 164, 166 and 168, respectively. Nitride spacers 176, 178, 180 and 182 each extend 1200 angstroms across substrate 102. Moreover, sidewall oxide 162 and nitride spacer 176 collectively form a source-side spacer for the active region 106, sidewall oxide 164 and nitride spacer 178 collectively form a drain-side spacer for active region 106, sidewall oxide 166 and nitride spacer 180 collectively form a source-side spacer for active region 108, and sidewall oxide 168 and nitride spacer 182 collectively form a drain-side spacer for active region 108.

Figure 1M:
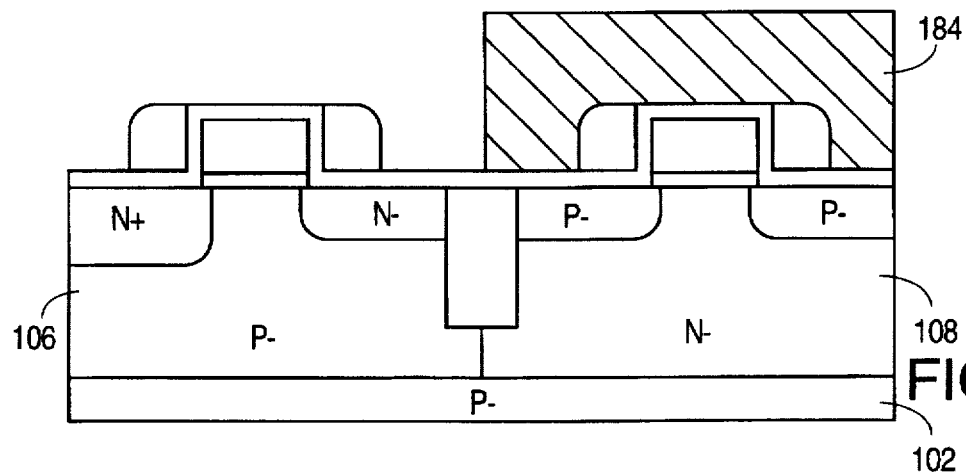

In FIG. 1M, photoresist 184 is deposited as a continuous layer over substrate 102 and selectively irradiated using the photolithographic system and the second reticle, and the irradiated portions are removed to provide an opening in photoresist 184. The opening is above active region 106, and photoresist 184 covers active region 108.

Figure 1N:
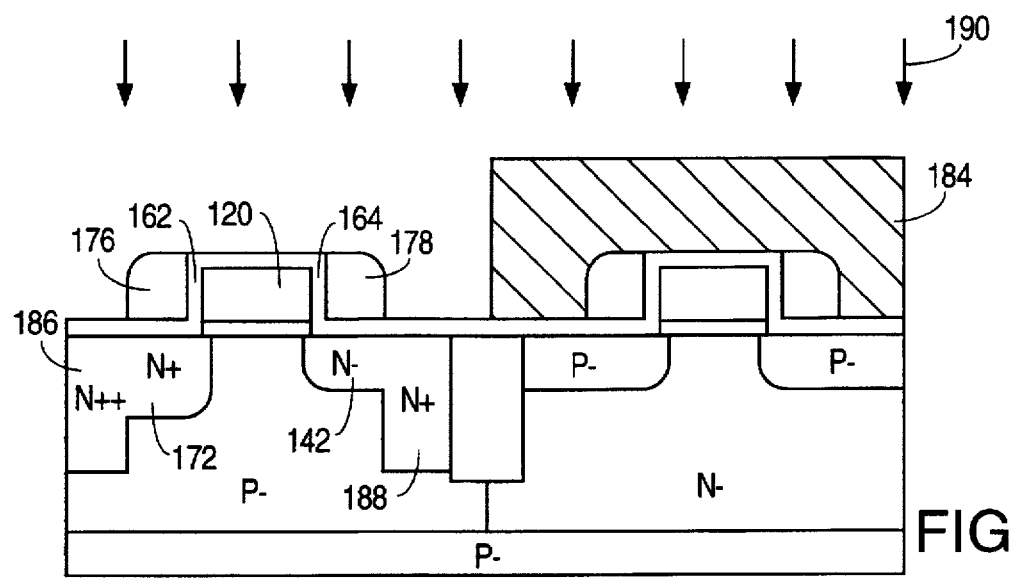

In FIG. 1N, a portion of heavily doped source region 172 outside oxide sidewall 162 and nitride spacer 176 is converted into ultra-heavily doped source region 186, and a portion of lightly doped drain region 142 outside oxide sidewall 164 and nitride spacer 178 is converted into heavily doped drain region 188 by subjecting the structure to ion implantation of arsenic, indicated by arrows 190, at a dose of $2 \times 10^{15}$ to $3 \times 10^{15}$ atoms/cm$^2$ and an energy in the range of 20 to 80 kiloelectron-volts. Polysilicon gate 120, sidewall oxides 162 and 164, nitride spacers 176 and 178, and photoresist 184 provide an implant mask for the underlying portion of substrate 102. As a result, ultra-heavily doped source region 186 is substantially aligned with nitride spacer 176 on the side opposite sidewall oxide 162, and heavily doped drain region 188 is substantially aligned with nitride spacer 178 on the side opposite sidewall oxide 164. Furthermore, the portion of heavily doped source region 172 beneath sidewall oxide 162 and nitride spacer 176 and the portion of lightly doped drain region 142 beneath sidewall oxide 164 and nitride spacer 178 are essentially unaffected. Ultra-heavily doped source region 186 is doped N++ with an arsenic concentration in the range of about $1.5 \times 10^{19}$ to $1 \times 10^{21}$ atoms/cm$^3$, and heavily doped drain region 188 is doped N+ with an arsenic concentration in the range of about $1 \times 10^{19}$ to $1 \times 10^{20}$ atoms/cm$^3$. Preferably, the dopant concentration of ultra-heavily doped source region 186 is at least 1.5 times that of heavily doped source region 172 and heavily doped drain region 188.

Figure 1O:
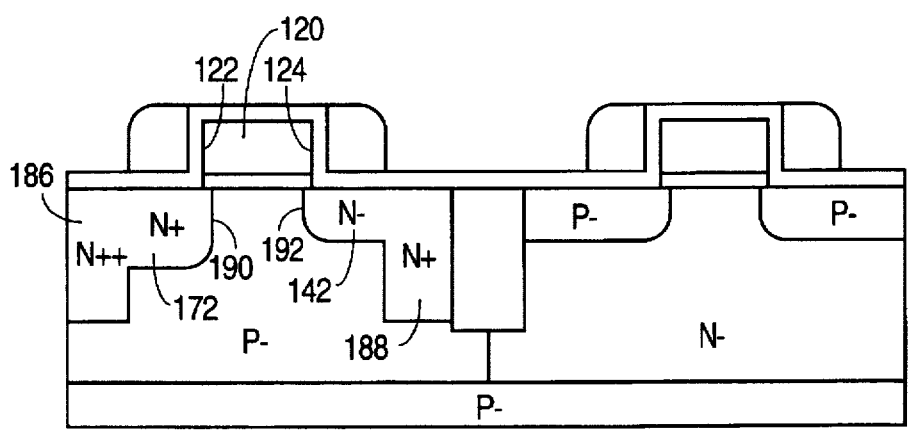

In FIG. 1O, photoresist 184 is stripped, and a rapid thermal anneal on the order of 900° to 1050° C. for 10 to 30 seconds is applied to remove crystalline damage and to drive-in and activate the implanted arsenic from the previous two ion implantations. As a result, heavily doped source region 172 and ultra-heavily doped source region 186 merge to form a source, and lightly doped drain region 142 and heavily doped drain region 188 merge to form a drain for an NMOS device controlled by polysilicon gate 120. Heavily doped source region 172 provides a first channel junction 190 that is substantially aligned with sidewall 122, and lightly doped drain region 142 provides a second channel junction 192 that is substantially aligned with sidewall 124. In addition, ultra-heavily doped source region 186 and heavily doped drain region 188 are spaced from channel junctions 190 and 192.

Figure 1P:
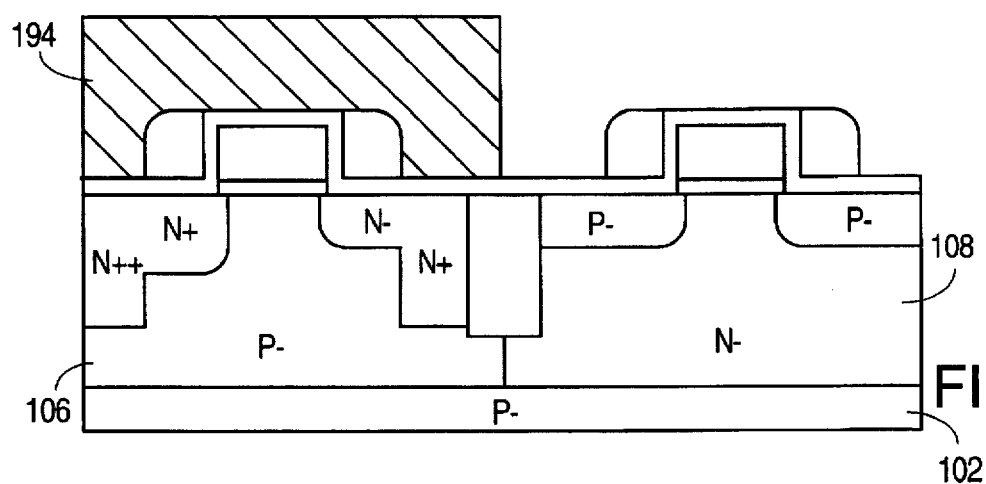

In FIG. 1P, photoresist 194 is deposited as a continuous layer over substrate 102 and selectively irradiated using the photolithographic system and the third reticle, and the irradiated portions are removed to provide an opening in photoresist 194. The opening is above active region 108, and photoresist 194 covers active region 106.

Figure 1Q:
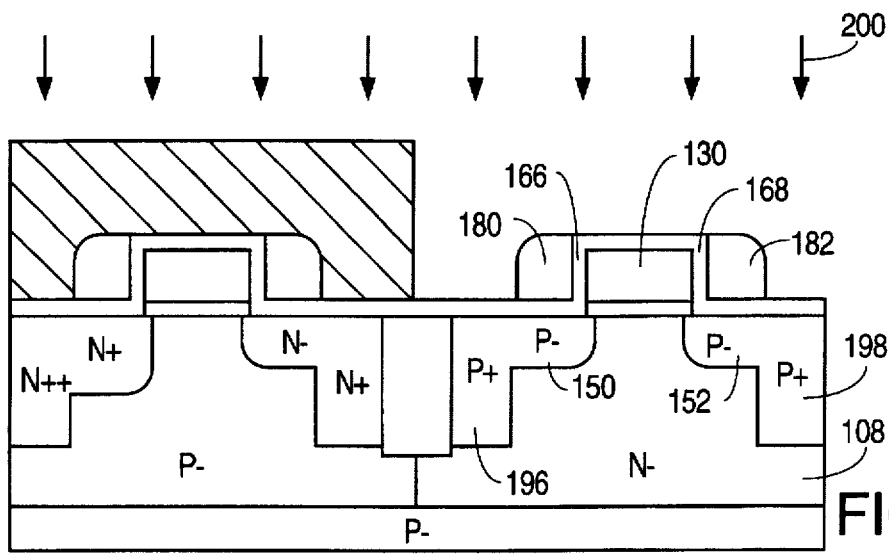

In FIG. 1Q, a portion of lightly doped source region 150 outside oxide sidewall 166 and nitride spacer 180 is converted into heavily doped source region 196, and a portion of lightly doped drain region 152 outside oxide sidewall 168 and nitride spacer 182 is converted into heavily doped drain region 198 by subjecting the structure to ion implantation of boron difluoride, indicated by arrows 200, at a dose in the range of $2 \times 10^{15}$ to $3 \times 10^{15}$ atoms/cm$^2$ and an energy in the range of 20 to 80 kiloelectron-volts. Polysilicon gate 130, sidewall oxides 166 and 168, nitride spacers 180 and 182, and photoresist 194 provide an implant mask for the underlying portion of substrate 102. As a result, heavily doped source region 196 is substantially aligned with nitride spacer 180 on the side opposite sidewall oxide 166, and heavily doped drain region 198 is substantially aligned with nitride spacer 182 on the side opposite sidewall oxide 168. Furthermore, the portion of lightly doped source region 150 beneath sidewall oxide 166 and nitride spacer 180 and the portion of lightly doped drain region 152 beneath sidewall oxide 168 and nitride spacer 182 are essentially unaffected. Heavily doped source region 196 is doped P+ with a boron concentration in the range of about $1 \times 10^{19}$ to $1 \times 10^{20}$ atoms/cm$^3$, and heavily doped drain region 198 is doped P+ with a boron concentration in the range of about $1 \times 10^{19}$ to $1 \times 10^{20}$ atoms/cm$^3$. Preferably, the dopant concentration of heavily doped source and drain regions 196 and 198 is at least 10 times that of lightly doped source and drain regions 150 and 152. At this point, the doping in active region 108 continues to be symmetrical.

Figure 1R:
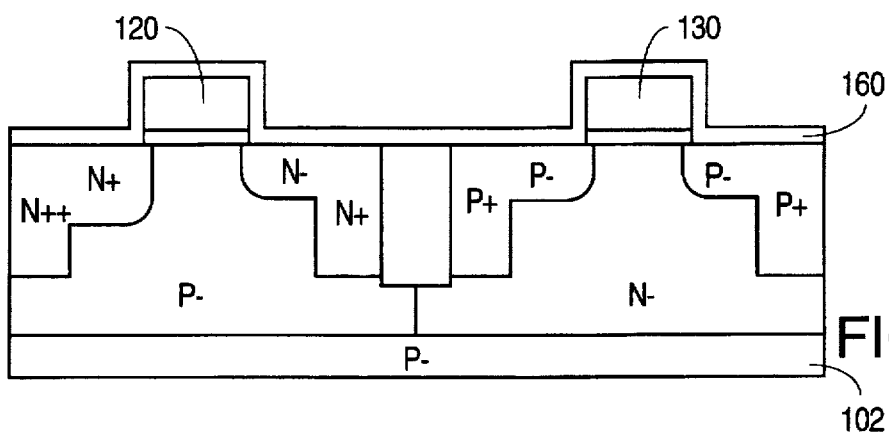

In FIG. 1R, photoresist 194 is stripped, and nitride spacers 176, 178, 180 and 182 are removed by applying a dry etch that is highly selective of silicon nitride with respect to silicon dioxide. Accordingly, oxide layer 160 is substantially unaffected by the etch, and oxide layer 160 provides an etch mask for polysilicon gates 120 and 130 and substrate 102.

Figure 1S:
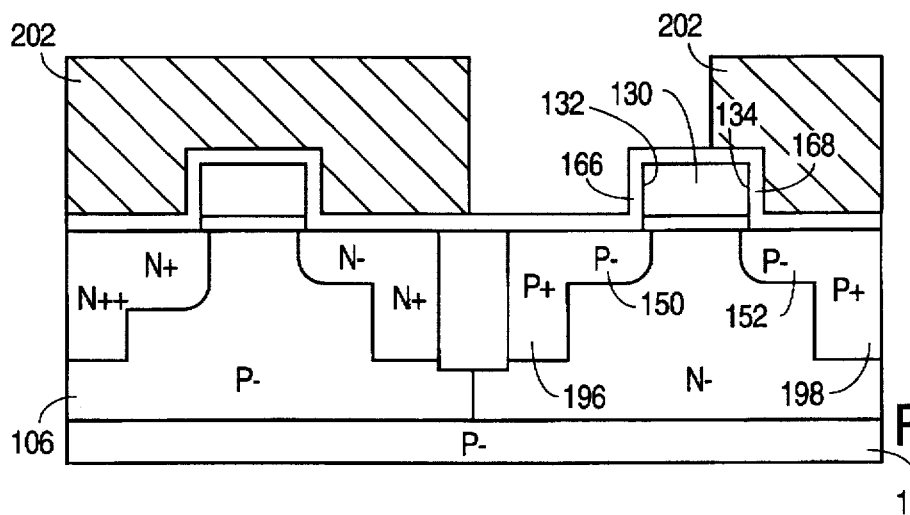

In FIG. 1S, photoresist 202 is deposited as a continuous layer over substrate 102 and selectively irradiated using the photolithographic system and a fifth reticle, and the irradiated portions are removed to provide an opening in photoresist 202. The opening is above heavily doped source region 196, lightly doped source region 150, sidewall oxide 166, and a first portion of polysilicon gate 130 adjacent to sidewall 132. Photoresist 202 covers lightly doped drain region 152, heavily doped drain region 198, sidewall oxide 168, a second portion of polysilicon gate 130 adjacent to sidewall 134, and active region 106.

Figure 1T:
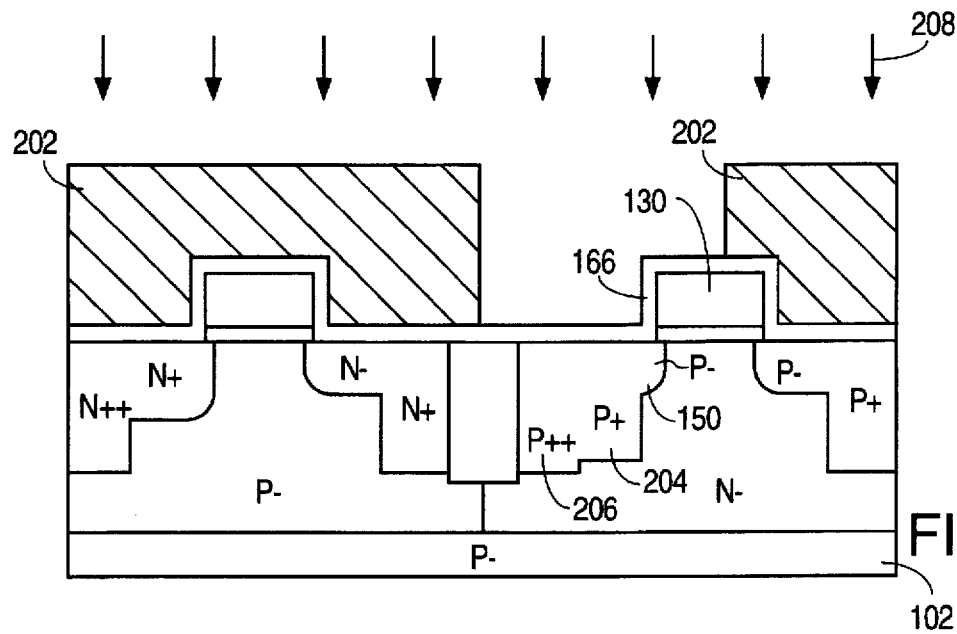

In FIG. 1T, substantially all of the remaining lightly doped source region 150 is converted into heavily doped source region 204, and heavily doped source region 196 is converted into ultra-heavily doped source region 206 by subjecting the structure to ion implantation of boron difluoride, indicated by arrows 208, at a dose of $4.5 \times 10^{15}$ atoms/cm$^2$ and an energy in the range of 10 to 80 kiloelectron-volts. Photoresist 202 and sidewall oxide 166 and the first portion of polysilicon gate 130 (outside photoresist 202) provide an implant mask for the underlying portion of substrate 102. As a result, heavily doped source region 204 is substantially aligned with sidewall oxide 166 on the side opposite polysilicon gate 130, and lightly and heavily doped drain regions 152 and 198 are essentially unaffected. Heavily doped source region 204 is doped P+ with a boron concentration in the range of about $1 \times 10^{19}$ to $1 \times 10^{20}$ atoms/cm$^3$, and ultra-heavily doped source region 206 is doped P++ with a boron concentration in the range of about $1.5 \times 10^{19}$ to $1 \times 10^{21}$ atoms/cm$^3$. Preferably, the dopant concentration of ultra-heavily doped source region 206 is at least 1.5 times that of heavily doped source and drain regions 204 and 198. As is seen, a very small portion of lightly doped source region 150 remains beneath sidewall oxide 166 and polysilicon gate 130.

Figure 1U:
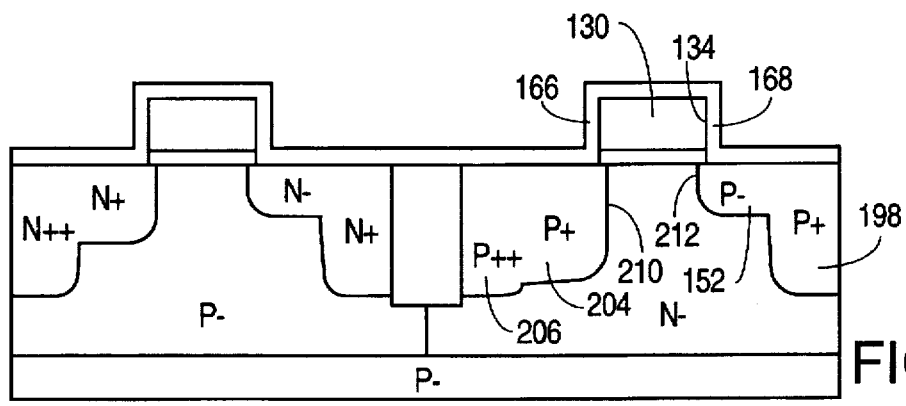

In FIG. 1U, photoresist 202 is stripped, and a rapid thermal anneal on the order of 900° to 1050° C. for 10 to 30 seconds is applied to remove crystalline damage and to drive-in and activate the implanted boron from the previous two ion implantations. As a result, heavily doped source region 204 diffuses into and essentially eliminates what remains of lightly doped source region 150. In addition, heavily doped source region 204 and ultra-heavily doped source region 206 merge to form a source, and lightly doped drain region 152 and heavily doped drain region 198 merge to form a drain for an PMOS device controlled by polysilicon gate 130. Heavily doped source region 204 provides a first channel junction 210 that is substantially aligned with sidewall 132, and lightly doped drain region 152 provides a second channel junction 212 that is substantially aligned with sidewall 134. In addition, ultra-heavily doped source region 206 and heavily doped drain region 188 are spaced from channel junctions 210 and 212.

Further processing steps in the fabrication of IGFETs typically include forming salicide contacts on the gates, sources and drains, forming a thick oxide layer over the active regions, forming contact windows in the oxide layer to expose the salicide contacts, forming interconnect metallization in the contact windows, and forming a passivation layer over the interconnect metallization. In addition, earlier or subsequent high-temperature process steps can be used to supplement or replace the desired anneal, activation, and drive-in functions. These further processing steps are conventional and need not be repeated herein. Likewise the principal processing steps disclosed herein may be combined with other steps apparent to those skilled in the art.

The present invention includes numerous variations to the embodiment described above. For instance, the gate insulators can remain outside the gates during the ion implantations. The sources may include very small lightly doped source regions adjacent to the channel junctions as long as the lightly doped source regions, if any, are far smaller than the lightly doped drain regions. The nitride spacers can be replaced by other materials, such as polysilicon, that can be selectively etched without removing the sidewall oxides. The spacers may include several layers of sequentially grown or deposited materials, of which only one layer need be subjected to the anisotropic etch. Alternatively, the sidewall insulators (e.g., sidewall oxide 162) can be omitted and the spacers can include a single layer of material such as silicon dioxide. The sidewall insulators can be formed at various stages between forming the gates and forming the insulative spacers (e.g., nitride spacer 176). For instance, the sidewall insulators can be formed before implanting any of the lightly doped regions, or the sidewall insulators can be formed after implanting the lightly doped regions and the first heavily doped source region (e.g., region 172). In these instances, implanting the first heavily doped source region converts the entire first lightly doped source region (e.g., region 140) into a heavily doped region. The gates can be various conductors, and the gate insulators can be various dielectrics. The device conductivities can be reversed. Suitable N-type dopants include arsenic, phosphorus and combinations thereof; suitable P-type dopants include boron, boron species (such as boron difluoride) and combinations thereof.

Further details regarding asymmetrical IGFETs are disclosed in U.S. application Ser. No. 08/711,383 [unassigned, attorney docket no. M-4289] filed concurrently herewith, entitled "Asymmetrical Transistor With Lightly Doped Drain Region, Heavily Doped Source and Drain Regions, and Ultra-Heavily Doped Source Region" by Gardner et al.; U.S. application Ser. No. 08/711,382 [unassigned, attorney docket no. M-4215] filed concurrently herewith, entitled "Asymmetrical Transistor With Lightly and Heavily Doped Drain Regions and Ultra-Heavily Doped Source Region" by Kadosh et al.; and U.S. application Ser. No. 08/711,957 [unassigned, attorney docket no. M-4356] filed concurrently herewith, entitled "Asymmetrical N-Channel and Symmetrical P-Channel Devices" by Gardner et al.; the disclosures of which are incorporated herein by reference.

The invention is particularly well-suited for fabricating N-channel MOSFETs, P-channel MOSFETs, and other types of IGFETs, as well as CMOS structures such as inverter circuits, particularly for high-performance microprocessors where high circuit density is essential. Although only a single pair of N-channel and P-channel devices has been shown for purposes of illustration, it is understood that in actual practice, many devices are fabricated on a single semiconductor wafer as widely practiced in the art. Accordingly, the invention is well-suited for use in an integrated circuit chip, as well as an electronic system including a microprocessor, a memory and a system bus.

Those skilled in the art will readily implement the steps necessary to provide the structures and methods disclosed herein, and will understand that the process parameters, materials, and dimensions are given by way of example only and can be varied to achieve the desired structure as well as modifications which are within the scope of the invention. Variations and modifications of the embodiments disclosed herein may be made based on the description set forth herein, without departing from the scope and spirit of the invention as set forth in the following claims.

What is claimed is:

1. A method of making asymmetrical N-channel and P-channel IGFETs, comprising the steps of:
   providing a semiconductor substrate with a first active region of a first conductivity type and a second active region of a second conductivity type;
   forming a first asymmetrical IGFET, including:
      forming a first gate with first and second opposing sidewalls over the first active region;
      applying a first ion implantation of the second conductivity type to form first lightly doped source and drain regions into the first active region;
      applying a second ion implantation of the second conductivity type to convert substantially all of the first lightly doped source region into a first heavily doped source region without doping the first lightly doped drain region;
      forming first and second spacers adjacent to the first and second sidewalls, respectively;
      applying a third ion implantation of the second conductivity type to convert a portion of the first heavily doped source region outside the first spacer into a first ultra-heavily doped source region without doping a portion of the first heavily doped source region beneath the first spacer, and to convert a portion of the first lightly doped drain region outside the second spacer into a first heavily doped drain region without doping a portion of the first lightly doped drain region beneath the second spacer; and
      forming a first source and a first drain in the first active region, wherein the first source includes the first heavily doped and ultra-heavily doped source regions, and the first drain includes the first lightly doped and heavily doped drain regions; and
   forming a second asymmetrical IGFET, including:
      forming a second gate with third and fourth opposing sidewalls over the second active region;
      forming a second source in the second active region; and
      forming a second drain in the second active region.

2. The method of claim 1, wherein the first source consists of the first heavily doped and ultra-heavily doped source regions, and the first drain consists of the first lightly doped and heavily doped drain regions.

3. The method of claim 2, wherein the first heavily doped and ultra-heavily doped source regions and the first lightly doped and heavily doped drain regions extend to a top surface of the substrate.

4. The method of claim 1, wherein:
   a dopant concentration of the first heavily doped source and drain regions is at least 10 times that of the first lightly doped drain region; and
   a dopant concentration of the first ultra-heavily doped source region is at least 1.5 times that of the first heavily doped source and drain regions.

5. The method of claim 4, wherein:
   the dopant concentration of the first lightly doped drain region is in the range of about $1 \times 10^{17}$ to $5 \times 10^{18}$ atoms/cm$^3$;
   the dopant concentration of the first heavily doped source and drain regions is in the range of about $1 \times 10^{19}$ to $1 \times 10^{20}$ atoms/cm$^3$; and
   the dopant concentration of the first ultra-heavily doped source region is in the range of about $1.5 \times 10^{19}$ to $1 \times 10^{21}$ atoms/cm$^3$.

6. The method of claim 1, including applying the first ion implantation of the second conductivity type using the first gate as an implant mask.

7. The method of claim 1, including:
   forming an insulating layer over the substrate, wherein the insulating layer includes first and second sidewall insulators adjacent to the first and second sidewalls, respectively;
   forming a masking layer over the first active region, wherein the masking layer includes an opening above the first lightly doped source region and the first sidewall insulator and a first portion of the first gate, and the masking layer covers the first lightly doped drain region and the second sidewall insulator and a second portion of the first gate; and
   applying the second ion implantation of the second conductivity type using the masking layer and the first portion of the first gate and the first sidewall insulator as an implant mask.

8. The method of claim 7, including:
   forming first and second insulative spacers adjacent to the first and second sidewall insulators, respectively, wherein the first spacer includes the first sidewall insulator and the first insulative spacer, and the second spacer includes the second sidewall insulator and second insulative spacer; and
   applying the third ion implantation using the first gate and the first and second spacers as an implant mask.

9. The method of claim 1, wherein forming the second IGFET includes:
   applying a first ion implantation of the first conductivity type to form second lightly doped source and drain regions into the second active region;
   forming third and fourth spacers adjacent to the third and fourth sidewalls, respectively;
   applying a second ion implantation of the first conductivity type to convert a portion of the second lightly doped source region outside the third spacer into a second heavily doped source region without doping a portion of the second lightly doped source region beneath the third spacer, and to convert a portion of the second lightly doped drain region outside the fourth spacer into a second heavily doped drain region without doping a portion of the second lightly doped drain region beneath the fourth spacer;
   removing at least portions of the third and fourth spacers; and
   applying a third ion implantation of the first conductivity type to convert the second heavily doped source region into a second ultra-heavily doped source region and to convert substantially all of the second lightly doped source region into a third heavily doped source region without doping the second lightly and heavily doped drain regions;
   wherein the second source includes the third heavily doped and the second ultra-heavily doped source regions, and the second drain includes the second lightly doped and heavily doped drain regions.

10. The method of claim 9, including, in sequence:
   forming the first and second gates;
   applying the first ion implantations;
   applying the second ion implantation of the second conductivity type;
   applying the third ion implantation of the second conductivity type;

applying the second ion implantation of the first conductivity type; and applying the third ion implantation of the first conductivity type.

11. The method of claim 10, wherein forming the first, second, third and fourth spacers includes:

forming an insulating layer over the substrate to provide first, second, third and fourth sidewall insulators adjacent to the first, second, third and fourth sidewalls, respectively;

depositing a blanket layer of insulative spacer material on the insulating layer; and applying an anisotropic etch such that first, second, third and fourth insulative spacers are adjacent to the first, second, third and fourth sidewall insulators, respectively;

wherein the first spacer includes the first sidewall insulator and the first insulative spacer, the second spacer includes the second sidewall insulator and the second insulative spacer, the third spacer includes the third sidewall insulator and the third insulative spacer, and the fourth spacer includes the fourth sidewall insulator and the fourth insulative spacer.

12. The method of claim 11, wherein removing the at least portions of the third and fourth spacers includes removing the first, second, third and fourth insulative spacers without removing the insulating layer.

13. The method of claim 11, including:

forming a first photoresist layer to protect the second active region from the first ion implantation of the second conductivity type;

forming a second photoresist layer to protect the first active region from the first ion implantation of the first conductivity type;

forming a third photoresist layer to protect the second active region and the first lightly doped drain region from the second ion implantation of the second conductivity type;

forming a fourth photoresist layer to protect the second active region from the third ion implantation of the second conductivity type;

forming a fifth photoresist layer to protect the first active region from the second ion implantation of the first conductivity type; and forming a sixth photoresist layer to protect the first active region and the second lightly and heavily doped drain regions from the third ion implantation of the first conductivity type.

14. The method of claim 1, wherein the first conductivity type is P-type and the first asymmetrical IGFET is the N-channel IGFET, and the second conductivity type is N-type and the second asymmetrical IGFET is the P-channel IGFET.

15. The method of claim 1, wherein the first and second asymmetrical IGFETs provide an inverter circuit.

16. A method of making asymmetrical N-channel and P-channel IGFETs, comprising the steps of:

providing a semiconductor substrate with a P-type active region and an N-type active region;

forming a first gate insulator on the P-type active region;

forming a second gate insulator on the N-type active region;

forming a first gate with first and second opposing sidewalls on the first gate insulator;

forming a second gate with third and fourth opposing sidewalls on the second gate insulator;

applying a first ion implantation of an N-type dopant to form lightly doped N-type source and drain regions in the P-type active region and substantially aligned with the first and second sidewalls, respectively;

applying a first ion implantation of a P-type dopant to form lightly doped P-type source and drain regions in the N-type active region and substantially aligned with the third and fourth sidewalls, respectively;

forming an insulating layer over the substrate, wherein the insulating layer includes first, second, third and fourth sidewall insulators adjacent to the first, second, third and fourth sidewalls, respectively;

applying a second ion implantation of an N-type dopant to convert substantially all of the lightly doped N-type source region into a heavily doped N-type source region without doping the lightly doped N-type drain region;

forming first, second, third and fourth insulative spacers adjacent to the first, second, third and fourth sidewall insulators, respectively, thereby providing a first spacer that includes the first sidewall insulator and the first insulative spacer, a second spacer that includes the second sidewall insulator and the second insulative spacer, a third spacer that includes the third sidewall insulator and the third insulative spacer, and a fourth spacer that includes the fourth sidewall insulator and the fourth insulative spacer;

applying a third ion implantation of an N-type dopant to convert a portion of the heavily doped N-type source region outside the first spacer into an ultra-heavily doped N-type source region without doping a portion of the heavily doped N-type source region beneath the first spacer, and to convert a portion of the lightly doped N-type drain region outside the second spacer into a heavily doped N-type drain region without doping a portion of the lightly doped N-type drain region beneath the second spacer;

applying a second ion implantation of a P-type dopant to convert a portion of the lightly doped P-type source region outside the third spacer into a first heavily doped P-type source region without doping a portion of the lightly doped P-type source region beneath the third spacer, and to convert a portion of the lightly doped P-type drain region outside the fourth spacer into a heavily doped P-type drain region without doping a portion of the lightly doped P-type drain region beneath the fourth spacer;

removing the first, second, third and fourth insulative spacers;

applying a third ion implantation of a P-type dopant to convert the first heavily doped P-type source region into an ultra-heavily dope P-type source region and to convert substantially all of the lightly doped P-type source region into a second heavily doped P-type source region without doping the lightly and heavily doped P-type drain regions;

forming an N-type source and drain in the P-type active region, wherein the N-type source includes the heavily doped and ultra-heavily doped N-type source regions, and the N-type drain includes the lightly doped and heavily doped N-type drain regions; and forming a P-type source and drain in the N-type active region, wherein the P-type source includes the second heavily doped and the ultra-heavily doped P-type source regions, and the P-type drain includes the lightly doped and heavily doped P-type drain regions.

17. The method of claim 16, including, in sequence:
forming the first and second gates;
applying the first ion implantations;
applying the second ion implantation of an N-type dopant;
forming the first, second, third and fourth insulative spacers;
applying the third ion implantation of an N-type dopant;
applying the second ion implantation of a P-type dopant;
removing the first, second, third and fourth insulative spacers; and
applying the third ion implantation of a P-type dopant.

18. The method of claim 17, wherein forming the first, second, third and fourth insulative spacers includes depositing a blanket layer of insulative spacer material on the insulating layer, and then applying a reactive ion etch.

19. The method of claim 18, wherein the first and second gates are polysilicon, the first and second gate insulators are silicon dioxide, the insulating layer is silicon dioxide, and the insulative spacers are selected from the group consisting of silicon nitride, silicon oxynitride and polysilicon.

20. A method of making asymmetrical N-channel and P-channel IGFETs, comprising the steps of:
providing a semiconductor substrate with a P-type active region and an N-type active region adjacent to an isolation region;
forming a first gate oxide on the P-type active region;
forming a second gate oxide on the N-type active region;
forming a first polysilicon gate with first and second opposing sidewalls on the first gate oxide;
forming a second polysilicon gate with third and fourth opposing sidewalls on the second gate oxide;
forming a first photoresist layer over the substrate, wherein the first photoresist layer includes an opening above the P-type active region and the first photoresist layer covers the N-type active region;
applying a first ion implantation of an N-type dopant using the first photoresist layer and the first polysilicon gate as an implant mask to form lightly doped N-type source and drain regions in the P-type active region and substantially aligned with the first and second sidewalls, respectively;
stripping the first photoresist layer;
forming a second photoresist layer over the substrate, wherein the second photoresist layer includes an opening above the N-type active region and the second photoresist layer covers the P-type active region;
applying a first ion implantation of a P-type dopant using the second photoresist layer and the second polysilicon gate as an implant mask to form lightly doped P-type source and drain regions in the N-type active region and substantially aligned with the third and fourth sidewalls, respectively;
stripping the second photoresist layer;
forming a third photoresist layer over the substrate, wherein the third photoresist layer includes an opening above the lightly doped N-type source region and the first sidewall and the third photoresist layer covers the second sidewall and the lightly doped N-type drain region and the N-type active region;
applying a second ion implantation of an N-type dopant using the third photoresist layer and a portion of the first polysilicon gate as an implant mask to convert substantially all of the lightly doped N-type source region into a heavily doped N-type source region without doping the lightly doped N-type drain region;
stripping the third photoresist layer;
forming an oxide layer over the substrate, wherein the oxide layer includes first, second, third and fourth sidewall oxides adjacent to the first, second, third and fourth sidewalls, respectively;
depositing a blanket layer of insulative spacer material on the oxide layer and then applying an anisotropic etch to form first, second, third and fourth insulative spacers adjacent to the first, second, third and fourth sidewall oxides, respectively, thereby providing a first spacer that includes the first sidewall oxide and the first insulative spacer, a second spacer that includes the second sidewall oxide and the second insulative spacer, a third spacer that includes the third sidewall oxide and the third insulative spacer, and a fourth spacer that includes the fourth sidewall oxide and the fourth insulative spacer;
forming a fourth photoresist layer over the substrate, wherein the fourth photoresist layer includes an opening that exposes the P-type active region and the fourth photoresist layer covers the N-type active region;
applying a third ion implantation of an N-type dopant using the fourth photoresist layer and the first polysilicon gate and the first and second spacers as an implant mask to convert a portion of the heavily doped N-type source region outside the first spacer into an ultra-heavily doped N-type source region without doping a portion of the heavily doped N-type source region beneath the first spacer, and to convert a portion of the lightly doped N-type drain region outside the second spacer into a heavily doped N-type drain region without doping a portion of the lightly doped N-type drain region beneath the second spacer;
stripping the fourth photoresist layer;
forming a fifth photoresist layer over the substrate, wherein the fifth photoresist layer includes an opening above the N-type active region and the fifth photoresist layer covers the P-type active region;
applying a second ion implantation of a P-type dopant using the fifth photoresist layer and the second polysilicon gate and the third and fourth spacers as an implant mask to convert a portion of the lightly doped P-type source region outside the third spacer into a first heavily doped P-type source region without doping a portion of the lightly doped P-type source region beneath the third spacer, and to convert a portion of the lightly doped P-type drain region outside the fourth spacer into a heavily doped P-type drain region without doping a portion of the lightly doped P-type drain region beneath the fourth spacer;
stripping the fifth photoresist layer;
removing the first, second, third and fourth insulative spacers without removing the first, second, third and fourth sidewall oxides;
forming a sixth photoresist layer over the substrate, wherein the sixth photoresist layer includes an opening above the lightly doped and the first heavily doped P-type source regions and the third sidewall, and the sixth photoresist layer covers the fourth sidewall and the lightly doped and heavily doped P-type drain regions and the P-type active region;

applying a third ion implantation of a P-type dopant using the sixth photoresist layer and a portion of the second polysilicon gate and the third sidewall oxide as an implant mask to convert the first heavily doped P-type source region into an ultra-heavily doped P-type source region and to convert substantially all of the lightly doped P-type source region into a second heavily doped P-type source region without doping the lightly and heavily doped P-type drain regions;

stripping the sixth photoresist layer;

forming an N-type source and drain in the P-type active region, wherein the N-type source includes the heavily doped and ultra-heavily doped N-type source regions, the N-type drain includes the lightly doped and heavily doped N-type drain regions, the N-type source provides a first channel junction, and the lightly doped N-type drain region provides a second channel junction; and forming a P-type source and drain in the N-type active region, wherein the P-type source includes the second heavily doped and the ultra-heavily doped P-type source regions, the P-type drain includes the lightly doped and heavily doped P-type drain regions, the P-type source provides a third channel junction, and the lightly doped P-type drain region provides a fourth channel junction.

* * * * *

UNITED STATES PATENT AND TRADEMARK OFFICE
CERTIFICATE OF CORRECTION

PATENT NO. : 5,677,224
DATED : October 14, 1997
INVENTOR(S) : Daniel Kadosh et al.

It is certified that error appears in the above-indentified patent and that said Letters Patent is hereby corrected as shown below:

In Col. 10, lines 35-36, delete "[unassigned, attorney docket no. M-4289]";
In Col. 10, lines 40-41, delete "[unassigned, attorney docket no. M-4215]";
In Col. 10, line 45, delete "[unassigned, attorney docket no. M-4356]".

Signed and Sealed this

Twenty-third Day of June, 1998

Attest:

BRUCE LEHMAN

*Attesting Officer*          *Commissioner of Patents and Trademarks*